(12) United States Patent
Ito et al.

(10) Patent No.: US 8,007,897 B2
(45) Date of Patent: Aug. 30, 2011

(54) INSULATING SHEET AND METHOD FOR PRODUCING IT, AND POWER MODULE COMPRISING THE INSULATING SHEET

(75) Inventors: Hiromi Ito, Tokyo (JP); Naoshi Yamada, Tokyo (JP); Kei Yamamoto, Tokyo (JP); Hirofumi Fujioka, Tokyo (JP); Takumi Kikuchi, Tokyo (JP); Osamu Yashiro, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/834,073

(22) Filed: Jul. 12, 2010

(65) Prior Publication Data

US 2010/0277872 A1 Nov. 4, 2010

Related U.S. Application Data

(63) Continuation of application No. 11/340,867, filed on Jan. 27, 2006, now abandoned.

(30) Foreign Application Priority Data

Jan. 27, 2005 (JP) ................................ P2005-019867

(51) Int. Cl.
*B32B 5/16* (2006.01)
*H05K 7/20* (2006.01)

(52) U.S. Cl. .......................... 428/143; 428/343; 361/712
(58) Field of Classification Search .................. 428/143, 428/343; 361/712
See application file for complete search history.

(56) References Cited

U.S. PATENT DOCUMENTS

| 6,060,150 A | 5/2000 | Nakatani et al. |
| 6,214,446 B1 | 4/2001 | Funada et al. |
| 6,225,701 B1 | 5/2001 | Hori et al. |
| 2002/0111415 A1 | 8/2002 | Mack, Sr. et al. |
| 2003/0148079 A1 | 8/2003 | Hirano et al. |

FOREIGN PATENT DOCUMENTS

| JP | 7-10955 U | 2/1995 |
| JP | 11-251368 A | 9/1999 |
| JP | 2000-216306 A | 8/2000 |
| JP | 2000-260918 A | 9/2000 |
| JP | 2002-194306 A | 7/2002 |
| JP | 2003-124400 A | 4/2003 |
| JP | 2003-152022 A | 5/2003 |
| JP | 2004-87735 A | 3/2004 |
| JP | 2004-140170 A | 5/2004 |
| JP | 2004-243650 A | 9/2004 |
| JP | 2005-235968 A | 9/2005 |
| JP | 2006-54221 A | 2/2006 |

*Primary Examiner* — William P Watkins, III
(74) *Attorney, Agent, or Firm* — Leydig, Voit & Mayer, Ltd.

(57) ABSTRACT

An insulating sheet includes an adhesive component of a thermosetting resin and containing a filler member. Heat conductivity of an adhesive face region of the insulating sheet is smaller than heat conductivity of an inner region of the insulating sheet.

3 Claims, 8 Drawing Sheets

INSULATING SHEET AND METHOD FOR PRODUCING IT, AND POWER MODULE COMPRISING THE INSULATING SHEET

BACKGROUND OF THE INVENTION

1. Field of the Invention

The present invention relates to an insulating sheet having good adhesiveness and heat conductivity and a method of producing it, and to a power module including the insulating sheet.

2. Description of the Related Art

Heretofore, a heat-conductive sheet is used as a heat conductor, attached to a heat generator of electric and electronic parts for transferring and radiating the heat from the heat generator to a heat sink member. For it, for example, there is known a laminate of a metal sheet of copper, aluminium or the like or a graphite sheet having a heat conductivity of at least 10 W/mK, with an adhesive layer containing a heat-conductive filler and capable of adhering at room temperature laminated on at least one surface of the sheet (for example, see JP-A-2002-194306 (page 1)).

However, since the above-mentioned heat-conductive sheet includes plural layers of a sheet material such as a metal sheet or a graphite sheet and an adhesive layer, there exists an interface of a metal or graphite surface and an organic component of the adhesive layer between the sheet material and the adhesive layer therein, and the adhesiveness of the heat-conductive sheet is low in and around the interface area. Therefore, the heat-conductive sheet of the type is problematic in that both the heat conductivity and the insulating property thereof are poor.

SUMMARY OF THE INVENTION

The present invention provides an insulating sheet having good heat conductivity and good insulating capability, of which the adhesiveness is prevented from lowering. The invention also provides a method for producing the insulating sheet and to provide a power module including the insulating sheet.

According to an aspect of the present invention, an insulating sheet includes an adhesive component of essentially a thermosetting resin and a filler member infiltrated into the component. A heat conductivity of an adhesive face region of the insulating sheet is smaller than a heat conductivity of an inner region except the adhesive face region of the insulating sheet.

The first insulating sheet of the invention includes an adhesive component of essentially a thermosetting resin and a filler member infiltrated into the component, wherein the heat conductivity of the adhesive face region of the insulating sheet is smaller than the heat conductivity of the inner region except the adhesive face region of the insulating sheet. Having the constitution, therefore, the advantage of the insulating sheet is that it is free from a trouble of adhesiveness reduction and has good heat conductivity.

DETAILED DESCRIPTION OF THE INVENTION

Embodiment 1

Figure 1:
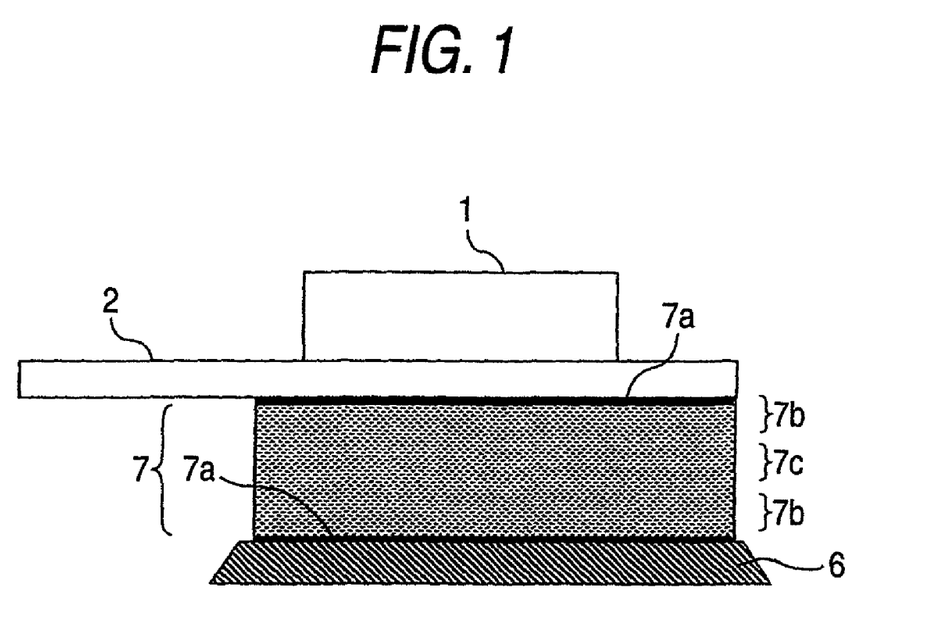
FIG. 1 is an explanatory view of an insulating sheet of an embodiment 1 of the invention.

FIG. 1 is an explanatory view of an insulating sheet of an embodiment 1 of the invention, which is used for adhesion of a lead frame (conductive member) 2 with a power semiconductor device 1 mounted thereon to a heat sink member 6. The insulating sheet 7 of this embodiment includes an adhesive component of essentially a thermosetting resin such as an epoxy resin, and a filler member dispersed in the component, in which the filler member is not uniformly dispersed in the adhesive component. The insulating 7 is divided into plural regions, in which one region is for participating in the adhesion of the insulating sheet 7 essentially to the lead frame (conductive member) 2 and to the heat sink member 6 (this is a region of from the adhesive face 7a of the insulating sheet 7 to the inside of the insulating sheet, and this region is referred to as an adhesive face region 7b, and in a thermosetting resin sheet, this region covers from the adhesive face up to a thickness of from 0.1 to 1000 μm of the sheet); and another is the other region except the adhesive face region (this region is referred to as an inner region 7c). In this embodiment, the filler member content of the adhesive face region 7b is smaller than that of the inner region 7c within a range within which the sheet adhesiveness reduction may be prevented, and the filler member content of the inner region 7c is controlled within a range within which the sheet may exhibit good heat conductivity. Having the specific constitution, the insulating sheet of this embodiment of the invention has good adhesiveness, good heat conductivity and good insulating capability.

With the increase in the current flow and the operation speed of power modules these days, the quantity of heat to be generated by a power semiconductor device in the module is increasing more and more; but on the other hand, down-sizing and high producibility of power modules is desired. To that effect, for improving the heat radiation efficiency of the module, it is desirable to use a metal of high heat conductivity for the heat sink member in the module, in which the conductive member with a power semiconductor device mounted thereon with electrical interconnection thereto must be electrically insulated from the heat sink member. The power module of the type therefore requires an insulating sheet which is to be put between the conductive member and the heat sink member and which has good insulating capability and good heat conductivity and has good adhesiveness both to the conductive member and to the heat sink member.

Figure 2:
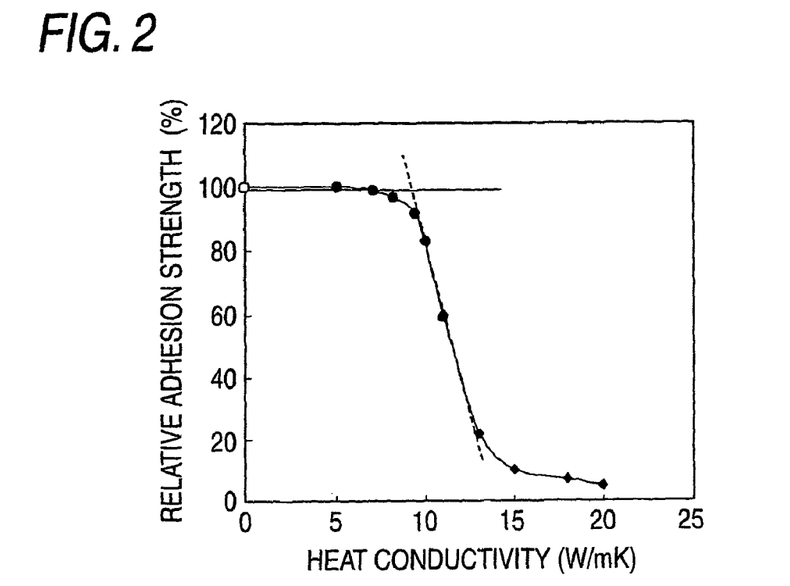
FIG. 2 is characteristic graph showing the specific adhesion strength profile of the insulating sheet of the embodiment 1 of the invention, depending on the heat conductivity thereof.

FIG. 2 is a characteristic graph showing a relative adhesion strength profile of the insulating sheet of this embodiment, depending on the heat conductivity thereof.

For changing the heat conductivity of the insulating sheet, the filler member content of the insulating sheet is controlled. An insulating sheet having a predetermined heat conductivity is formed, for example, on a cupper substrate, and the adhesion strength between the insulating sheet and the copper substrate is measured. The adhesion strength between the insulating sheet and the copper substrate is a relative adhesion strength based on the adhesion strength (100%) of an insulating sheet of an adhesive component alone with no filler member therein (its heat conductivity is 0.2 w/mK).

As is known from FIG. 2, the increase in the filler member content results in the increase in the heat conductivity, but when the heat conductivity becomes over 8 W/mK as a result of the increase in the filler member content, the adhesion strength begins to lower since the interface between the filler member and the organic component in the adhesive component increases and defects such as voids therefore increase, and when the heat conductivity becomes larger than 10 W/mK, then the adhesion strength comes to lower greatly.

Figure 3:
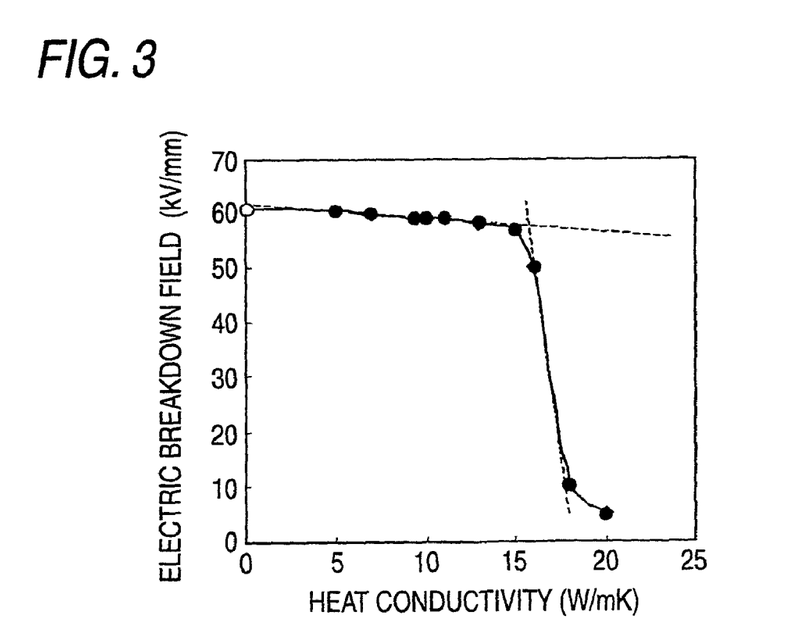
FIG. 3 is a characteristic graph showing the electric breakdown field intensity profile of the insulating sheet of the embodiment 1 of the invention, depending on the heat conductivity thereof.

FIG. 3 is a characteristic graph showing a heat conductivity-dependent, electric breakdown profile of a 1-mm thick insulating sheet having a varying heat conductivity as above. FIG. 3 confirms the following: The increase in the filler member content results in the increase in the heat conductivity of the insulating sheet, but when the filer member content increases and when the heat conductivity becomes over 15 W/mK, then the electric breakdown field intensity begins to lower since the interface between the filler member and the organic component in the adhesive component increases and defects such as voids therefore increase, and when the heat conductivity becomes larger than 16 W/mK, then the electric breakdown field intensity comes to lower greatly.

Accordingly, FIG. 2 and FIG. 3 indicate the following: When a sheet having a high heat conductivity of, for example, at least 10 W/mK is desired to be produced by uniformly introducing the above-mentioned filler member to the above-mentioned adhesive component, then the electric breakdown intensity of the sheet may be enough but the adhesion strength thereof lowers. On the other hand, when a sheet having a filler member uniformly dispersed therein and having a high adhesion strength and a high electric breakdown intensity is desired to be produced, then the heat conductivity of the sheet produced may be significantly lower than 10 W/mk.

From the above, the following is understood: When a high-conductivity sheet having good adhesiveness and good insulating capability and having a heat conductivity of at least 10 W/mK that is higher than that of ordinary sheets, then the composition of the sheet must be so designed that the face region (adhesive face region) of the sheet having the function of adhering essentially to a conductive member or a heat sink member shall have a high adhesion strength when it has a low heat conductivity of at most 10 W/mK, preferably at most 8 W/mK, that the inner region except the adhesive face region shall have a high heat conductivity of from 10 to 16 W/mk, and that the heat conductivity of the adhesive face region is made smaller than the heat conductivity of the inner region. Accordingly, as compared with an insulating sheet formed of a composition with a filler member uniformly dispersed therein, the insulating sheet specifically so designed as above may satisfy all the requirements of good adhesiveness, good insulating capability and good heat conductivity.

The filler member may be dispersed in the insulating sheet of this embodiment, for example, in the manner as follows: The filler member content profile in the insulating sheet may be so inclined that the filler member content may successively increase from the adhesive face toward the inside of the sheet whereby the heat conductivity of the insulating sheet may successively increase from the adhesive face toward the inside thereof; or the filler member content of the sheet may be stepwise varied in the adhesive face region 7b and the inner region 7c of the sheet whereby the heat conductivity of the adhesive face region of the insulating sheet is made to stepwise differ from the heat conductivity of the inner region except the adhesive face region of the insulating sheet.

The filler member in the insulating sheet of this embodiment may be a flattened or granular filler, or may be a sheet with through-holes.

The flattened filler is a filler having a flattened shape prepared by crushing a three-dimensional shape. Its thickness is thin, and it is not limited to rectangular forms having major sides and minor sides and having a four-sided cross section, but may include any other polygons and ovals with suitably rounded corners. In addition, it may also have a regular square or regular polygonal form having the same major sides and minor sides, or a circular form. The filler of the type may be prepared by crushing its material, or may originally have any of those forms. For example, it includes aluminium oxide (alumina), boron nitride, silicon carbide, mica; and two or more of these may be used herein as combined.

The granular filler is preferably a nearly spherical one, but may have a polyhedral form as prepared by grinding. Its material includes, for example, aluminium oxide (alumina), silicon oxide (silica), aluminium nitride, silicon carbide, boron nitride.

The granular filler may also be prepared by aggregating the above-mentioned flattened filler or granular filler particles.

The sheet with through-holes is, for example, a conductive metal sheet with through-holes, a ceramic sheet with through-holes, a ceramic sheet with metal-coated through-holes, or a glass laminate with metal-coated through-holes. In the insulating sheet of the type, the adhesive component continues through the through-holes therein, and the sheet is therefore free from a trouble of delamination to be caused by interface continuation therein. The conductive filler member such as a metal sheet with through-holes is preferably used not in the adhesive face region but in the inner region, especially in the center part, or that is, the core region in the thickness direction of the inner region, in view of the stability of the insulating property of the sheet.

The thermosetting resin that is the essential ingredient of the adhesive component to be in the insulating sheet of this embodiment may be, for example, an epoxy resin. Concretely, it includes a liquid bisphenol A-type epoxy resin (trade name: Epikote 828 by Japan Epoxy); a liquid bisphenol F-type epoxy resin (trade name: Epikote 807 by Japan Epoxy); a solid bisphenol A-type epoxy resin (trade name: Epikote 1001 by Japan Epoxy); an ortho-cresol-novolak-type epoxy resin (trade name: EOCN-102S by Nippon Kayaku); a phenol-novolak-type epoxy resin (trade name: Epikote 152 by Japan Epoxy); an alicyclic-aliphatic epoxy resin (trade name: CY179 by Vantico); a glycidyl-aminophenol-type epoxy resin (trade name: ELM100 by Sumitomo Chemical); a special polyfunctional epoxy resin (trade name: EPPN501 by Nippon Kayaku). Two or more of these may be used, as combined.

As a curing agent, herein usable are alicyclic acid anhydrides such as methyltetrahydrophthalic anhydride, methylhexahydrophthalic anhydride, himic anhydride; aliphatic acid anhydrides such as dodecenylsuccinic anhydride; aromatic acid anhydrides such as phthalic anhydride, trimellitic anhydride; organic dihydrazides such as dicyandiamide, adipic acid dihydrazide; tris(dimethylaminomethyl)phenol, dimethylbenzylamine, 1,8-diazabicyclo(5,4,0)undecene, and their derivatives; imidazoles such as 2-methylimidazole, 2-ethyl-4-methylimidazole, 2-phenylimidazole. Using any of these, solid sheets may be produced. Two or more of these may be used herein, as combined.

As a viscosity improver, suitably usable herein is an organic solvent such as acetone, toluene.

Embodiment 2

Figure 4A:
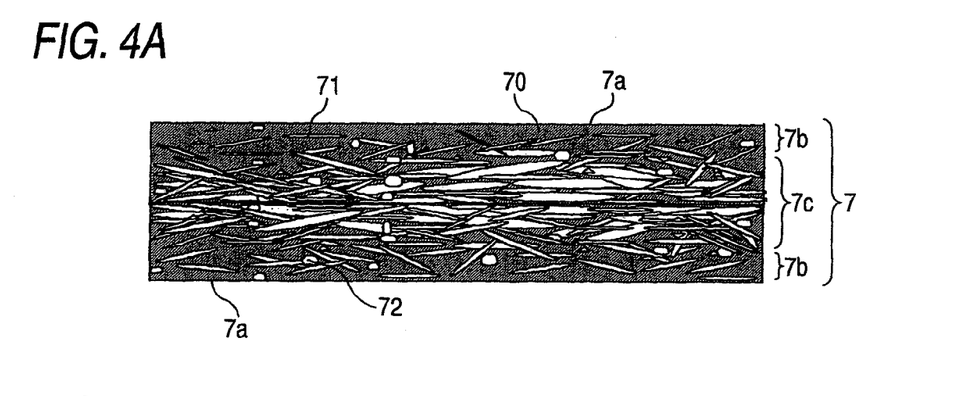
FIGS. 4A and 4B are explanatory views graphically showing an insulating sheet of an embodiment 2 of the invention.
Figure 4B:
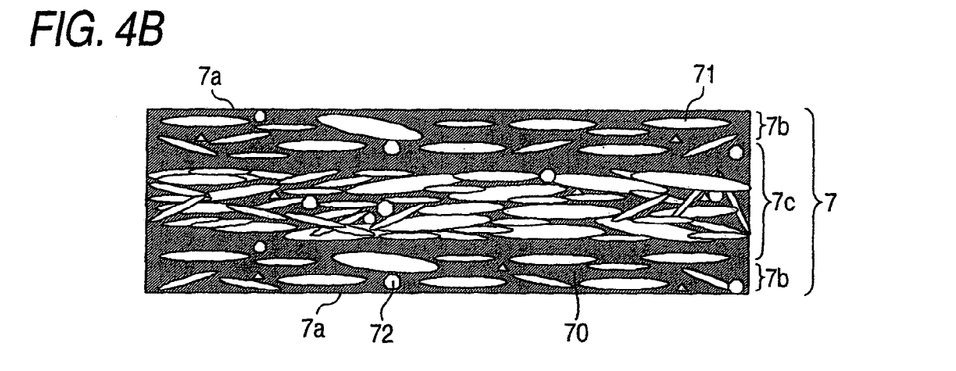

FIGS. 4A and 4B are explanatory views graphically showing an insulating sheet 7 of an embodiment 2 of the invention, in which a filler member including a flattened filler 71 and a granular filler 72 is dispersed in an adhesive component 70. Since the insulating sheet 7 has an adhesive face 7a on both sides thereof, the upper and lower face regions of the insulating sheet 7 are adhesive face regions 7b. The filler member content of the sheet 7 is so controlled that the filler member content of the adhesive face region 7b is smaller than that of the inner region 7c, and that the heat conductivity of the adhesive face region 7b and the inner region 7c falls within the scope as in the embodiment 1.

In FIG. 4A, the filler member content successively continuously increases from the adhesive face of the insulating sheet toward the inner direction (center part) thereof.

In FIG. 4B, the filler member content of the sheet is controlled relative to the overall volume of the filler member that includes the flattened filler 71 and the granular filler 72, whereby the heat conductivity of the adhesive face region 7b and the inner region 7c is made to stepwise change. To that effect, the filler member content of the adhesive face region 7b is smaller than that of the inner region 7c, and the heat conductivity of the adhesive face region 7b and the inner region 7c falls within the scope as in the embodiment 1.

Having the constitution as above, the insulating sheet 7 of this embodiment ensures good adhesiveness as the content of the thermosetting resin component in the adhesive face region 7b thereof is enough, and it ensures good heat conductivity owing to the inner region 7c thereof. Accordingly, as compared with a single use of an insulating sheet, which contains a large amount of a filler member so as to have a high heat conductivity and which therefore has extremely lowered adhesiveness and insulating capability, the invention provides an insulating sheet having both good adhesiveness and good heat conductivity.

Figure 5:
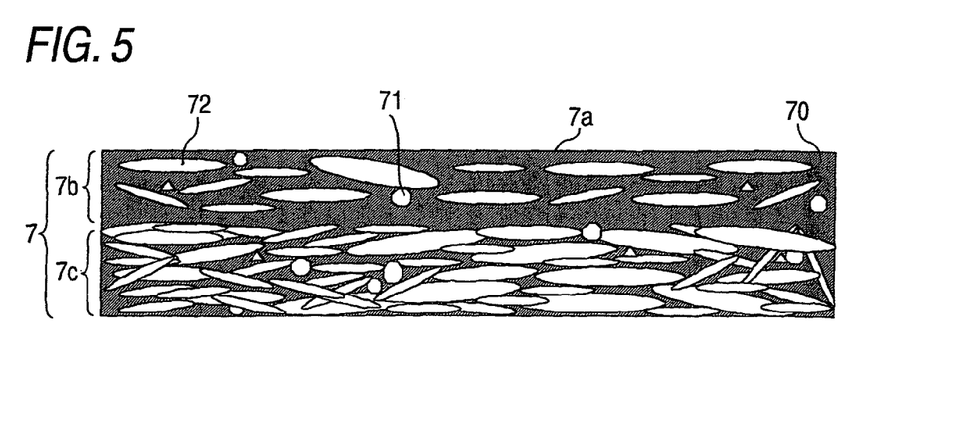
FIG. 5 is an explanatory view graphically showing another insulating sheet of the embodiment 2 of the invention.

FIG. 5 is an explanatory view graphically showing another insulating sheet 7 of the embodiment 2 of the invention, in which the insulating sheet 7 has an adhesive face 7a only on one side thereof. The sheet 7 has an adhesive face region 7b on its adhesive face side and has an inner region 7c on the other side thereof, and this is favorably used as a sheet structure that requires adhesiveness only on one side thereof.

Embodiment 3

Figure 6A:
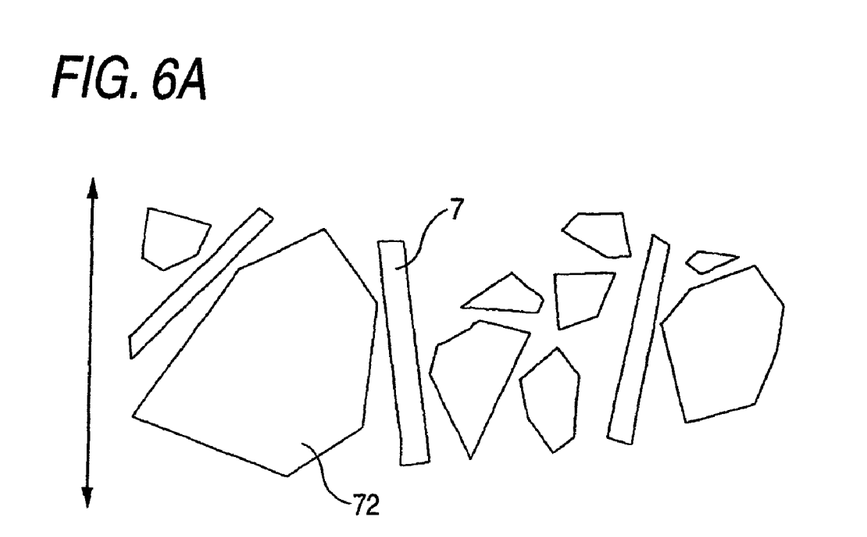
FIGS. 6A and 6B are explanatory views graphically showing a condition of a filler member filled in an insulating sheet of an embodiment 3 of the invention.
Figure 6B:
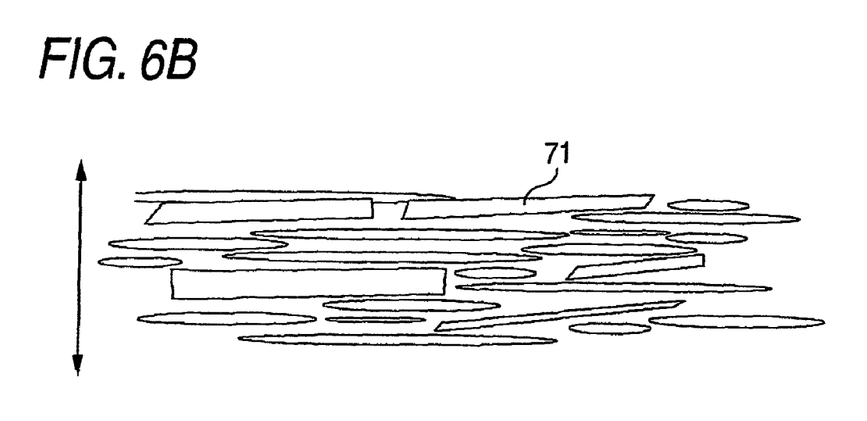

FIGS. 6A and 6B are explanatory views graphically showing a condition of a filler member filled in an insulating sheet of an embodiment 3 of the invention, in which the arrow indicates the thickness direction of the insulating sheet. FIG. 6A is a case where the filler member includes a flattened filler 71 and a granular filler 72 as mixed; and FIG. 6B is a case where a flattened filler 71 alone is used.

Specifically, the insulating sheet of this embodiment is the same as that of the embodiment 1, except that both a flattened filler 71 and a granular filler 72 are used in the embodiment 1 (FIG. 6A); or only a flattened filler 71 is used (FIG. 6B). When both a flattened filler 71 and a granular filler 72 are used in the insulating sheet, then the granular filler supports the flattened filler therein, and it orients the flattened filler in the direction of the major side of the sheet. Accordingly, the heat radiation efficiency of the insulating sheet of the type in the thickness direction thereof may be extremely improved, and the frequency of overlapping the flattened filler particles in the sheet may be reduced, and the amount of the filler that may be in the sheet may be increased.

When only a flattened filler 71 is used in the insulating sheet as in FIG. 6B, then the flattened filler particles may be oriented while overlapping with each other, and therefore the insulating capability such as the electric breakdown field intensity of the sheet may be increased.

Embodiment 4

Figure 7A:
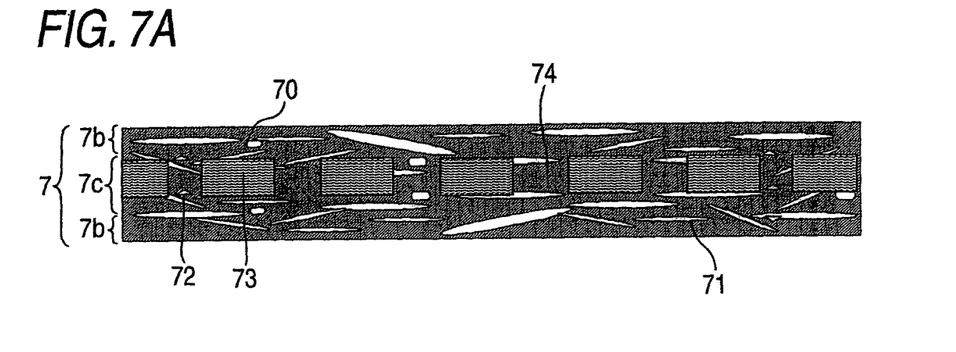
FIGS. 7A and 7B are explanatory views graphically showing an insulating sheet of an embodiment 4 of the invention.
Figure 7B:
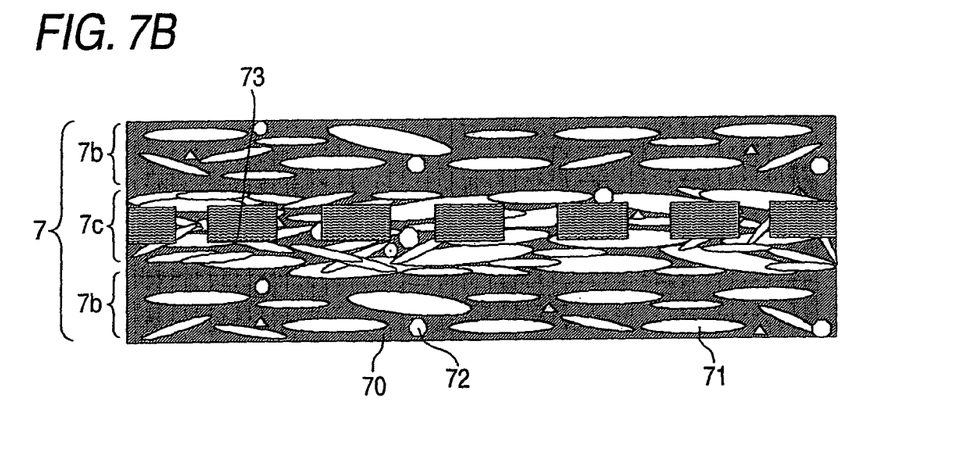

FIGS. 7A and 7B are explanatory views graphically showing an insulating sheet 7 of an embodiment 4 of the invention. FIG. 7A is an insulating sheet with fillers 71 and 72 uniformly dispersed in an adhesive component 70 in such a manner that the heat conductivity of the sheet may fall within the range of the heat conductivity in the adhesive face region in the embodiment 1. In this, a metal sheet 73 having good heat conductivity and having through-holes 74 therein is disposed as a filler member in the core region that is the center region in the thickness direction of the inner region 7c. FIG. 7B is a modification of the insulating sheet of the embodiment 2, in which the above-mentioned metal sheet 73 is disposed as a filler member in the center part (core region) of the inner region 7c of the sheet. In particular, it is desirable that the conductive filler member such as the above-mentioned metal sheet 73 is used in the inner region of the sheet rather than in the adhesive face region thereof, especially in the core region of the sheet, in view of the stability of the insulating capability of the sheet. In any case of this embodiment, the resin continues through the through-holes of the metal sheet 73, and therefore the interface between the metal sheet and the thermosetting resin in the insulating sheet does not continue and the sheet of the type is free from a trouble of interfacial delamination.

In the adhesion with the insulating sheet 7 of the embodiments 1 to 4, a coupling agent may be added to the adhesive component for the purpose of further increasing the adhesion strength of the sheet.

The coupling agent includes, for example, γ-glycidoxypropyltrimethoxysilane, N-β-(aminoethyl)-γ-aminopropyltriethoxysilane, N-phenyl-γ-aminopropyltrimethoxysilane, γ-mercaptopropyltrimethoxysilane. Two or more of these coupling agents may be used herein as combined.

Embodiment 5

Figure 8:
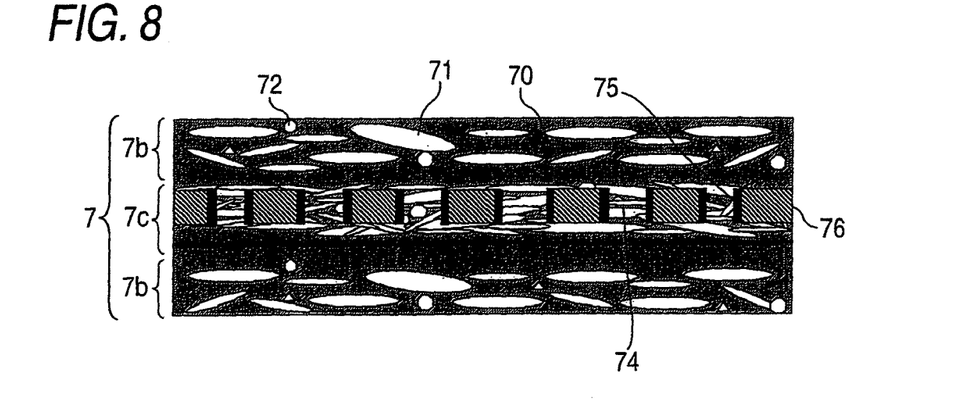
FIG. 8 is an explanatory view graphically showing an insulating sheet of an embodiment 5 of the invention.

FIG. 8 is an explanatory view graphically showing an insulating sheet 7 of an embodiment 5 of the invention. This is a modification of the insulating sheet of the embodiment 2, in which an insulating plate 76 such as a glass laminate plate having therein through-holes 74 coated with a metal layer 75 such as copper on the surface thereof is disposed as a filler member in the core region of the center region in the thickness direction of the inner region 7c of the sheet. The copper 75 applied to the through-holes imparts heat conductivity to the sheet, and the resin continues through the through-holes in the sheet with no interface therein. The sheet is therefore free from a trouble of interfacial delamination. In the insulating sheet of this embodiment uses the insulating plate as above, and the insulating plate used in the sheet may protect the sheet from receiving the curing pressure and the resin shrinkage stress that may be applied thereto during the process of producing the sheet described below.

Embodiment 6

Figure 9A:
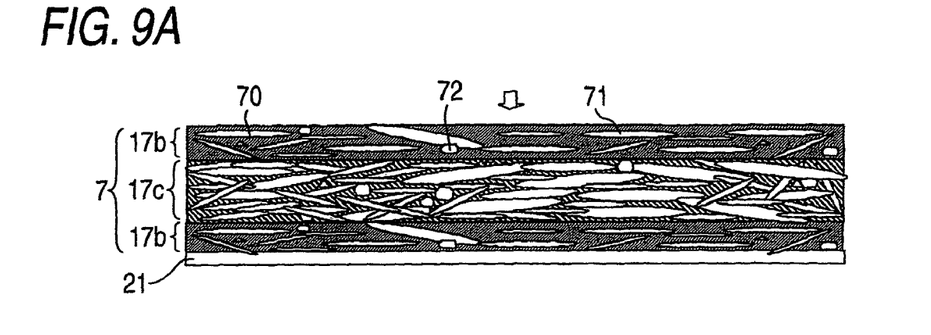
FIGS. 9A to 9C are explanatory views of a lamination step in a process of producing an insulating sheet of an embodiment 6 of the invention.
Figure 9B:
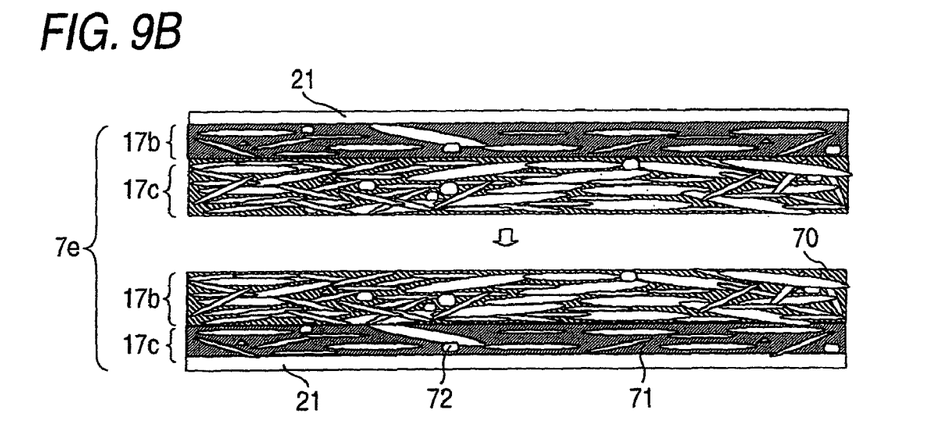
Figure 9C:
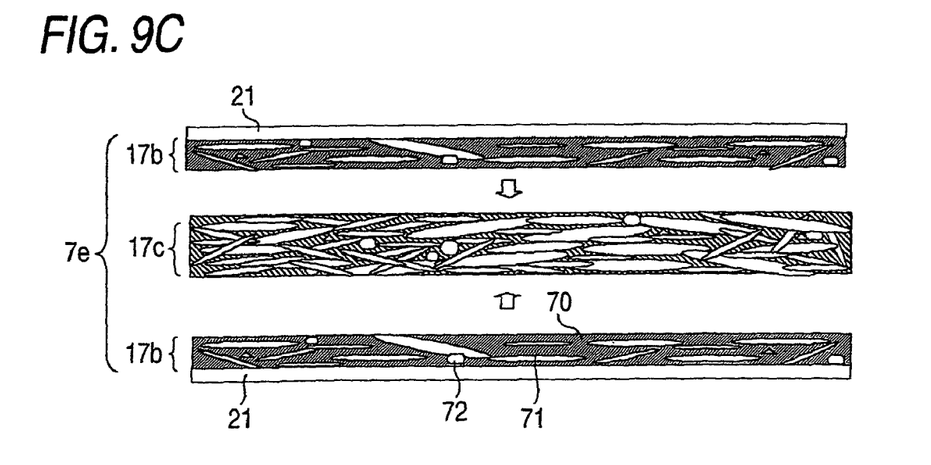

FIGS. 9A to 9C are explanatory views of a lamination step in a process of producing an insulating sheet of an embodiment of the invention, in which the arrow indicates the lamination direction.

Concretely, on a substrate 21 such as copper, successively formed are a first layer 17b of a first insulating sheet composition to be an adhesive face region; a second layer 17c of a second insulating sheet composition to be an inner region; and a first layer 17b of a first insulating sheet composition to be an adhesive face region, thereby giving an A- or B-stage laminate 7e (FIG. 9A).

On the substrate 21, successively formed are a first layer 17b of a first insulating sheet composition to be an adhesive face region, and a second layer 17c of a second insulating sheet composition to be an inner region; and two of these structures are laminated to give an A- or B-stage laminate 7e (FIG. 9B).

On the substrate 21, formed is a first layer 17b of a first insulating sheet composition to be an adhesive face region; and this is stuck to a second layer 17c of a second insulating sheet composition to be an inner region, thereby giving an A- or B-stage laminate 7e (FIG. 9C).

The filler member content of the first insulating sheet composition to be the above adhesive face region is smaller than the filler member content of the second insulating sheet composition to be the inner region; and every insulating sheet composition shall have, after thermally cured, a thermal conductivity that falls with the range indicated in the embodiment 1.

When the laminate 7e obtained in the manner as above, in which the adhesive component is in an A- or B-stage condition, is pressed, then the resin of the first layer 17b of the first insulating sheet composition to be an adhesive face region and the resin of the second layer 17c of the second insulating sheet composition to be an inner region are mixed together not forming an interface therebetween, and an insulating sheet of this embodiment is thus obtained such that the insulating sheet has continuous layers as a whole with no interface therebetween. When the sheet is produced in the manner as above, then air having a low heat conductivity may be pushed out during the process and porous defects may be removed from the sheet produced. Accordingly, the advantages of the process are that heat can be efficiently transferred to the sheet and the sheet produced may have a high heat conductivity and, in addition, since voids and other defects unfavorable for the insulating capability of the sheet may be prevented and corona generation may also be prevented, the sheet thus obtained herein may have an improved insulating capability.

Embodiment 7

Figure 10:
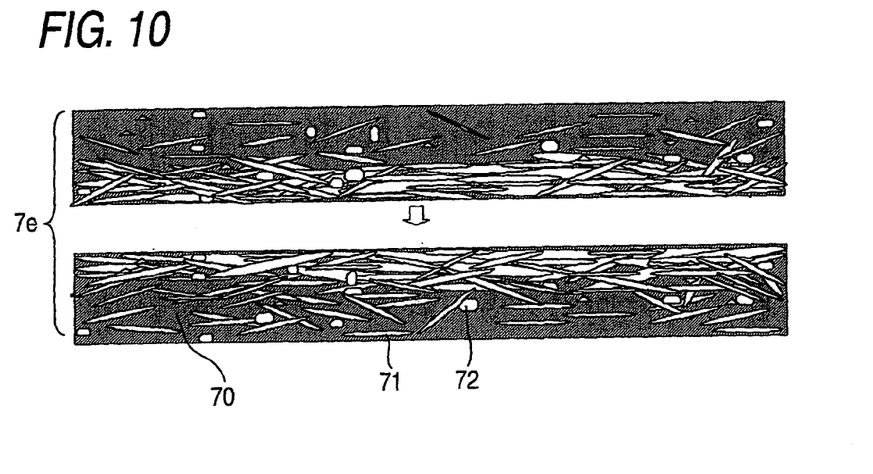
FIG. 10 is an explanatory view of a lamination step in a process of producing an insulating sheet of an embodiment 7 of the invention.

FIG. 10 is an explanatory view of a lamination step in a process of producing an insulating sheet of an embodiment 7 of the invention, in which the arrow indicates the lamination direction.

Concretely, an insulating sheet composition with a filler member dispersed in an adhesive component is applied onto a release film; and two of the same structure are prepared. In the thus-coated structure, the filler member distribution is controlled so as to satisfy the heat conductivity range as in the embodiment 1, or that is, owing to the difference in the specific gravity between the filler member and the adhesive component and therefore owing to the difference in the precipitating velocity therebetween, the adhesive face region 7b and the inner region 7c formed may satisfy that heat conductivity range. Then, the release film is removed, and the two are laminated in such a manner that the filler member concentration may increase toward the center of the resulting laminate. Thus, a laminate 7e is obtained, and this is pressed in the same manner as in the embodiment 6, whereby the resins of the insulating sheet compositions are mixed together with no interface formation, and an insulating sheet of this embodiment is thus obtained such that the insulating sheet has continuous layers as a whole with no interface therebetween.

When the sheet is produced in the manner as above, then air having a low heat conductivity may be pushed out during the process and porous defects may be removed from the sheet produced. Accordingly, the advantages of the process are that heat can be efficiently transferred to the sheet and the sheet produced may have a high heat conductivity and, in addition, since voids and other defects unfavorable for the insulating capability of the sheet may be prevented and corona generation may also be prevented, the sheet thus obtained herein may have an improved insulating capability.

Embodiment 8

Figure 11:
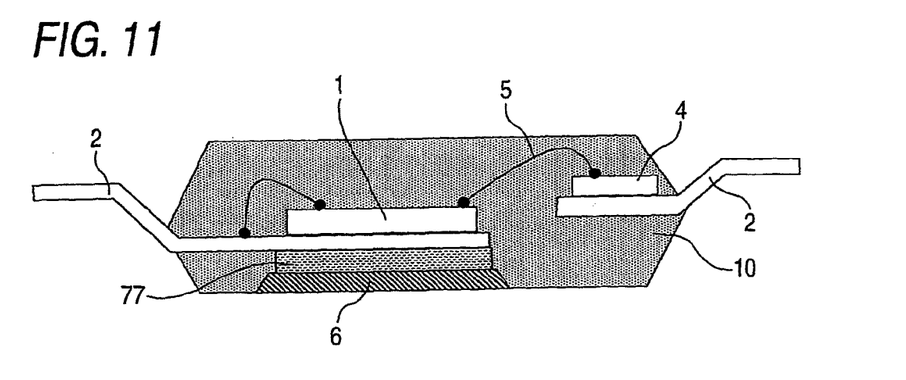
FIG. 11 is a constitutional view of a power module of an embodiment 8 of the invention.
Figure 12:
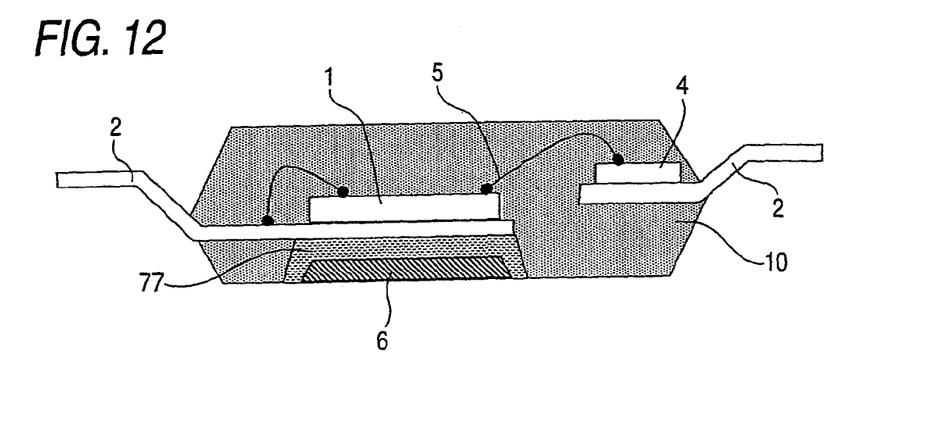
FIG. 12 is a constitutional view of a power module of an embodiment 8 of the invention.
Figure 13:
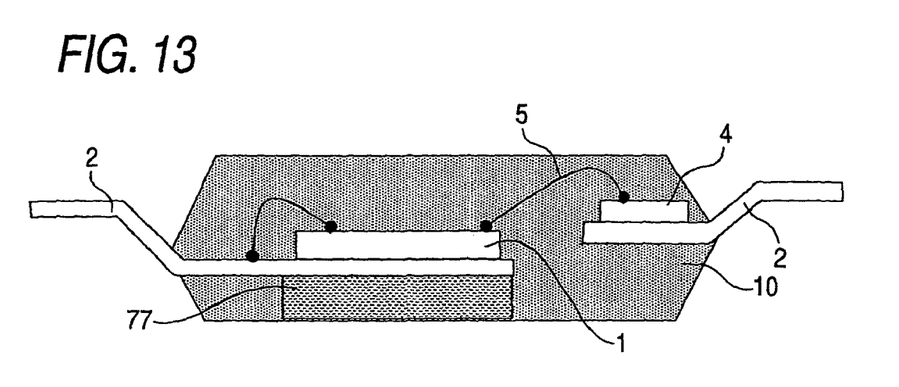
FIG. 13 is a constitutional view of a power module of an embodiment 8 of the invention.

FIG. 11, FIG. 12 and FIG. 13 are constitutional views of a power module of an embodiment 8 of the invention, in which a power semiconductor device 1 is mounted on a lead frame (conductive member) 2; a cured insulating sheet 77 of the above-mentioned embodiments 1 to 7 is provided, stuck to the conductive member 2 and a heat sink member 6, and is connected to a control semiconductor device 4 separately mounted on the lead frame 2, via a metal wire 5; and the constitutive members are encapsulated with a mold resin 10.

The insulating sheet of the above-mentioned embodiments may be, as an A- or B-stage semi-cured solid sheet, disposed between the lead frame 2 and the heat sink member 6, and then thermally cured whereby the lead frame 2 and the heat sink member 6 may be stuck to each other at high producibility. The step of sticking the lead frame 2 to the heat sink member 6 by curing reaction of the insulating sheet may be effected simultaneously with the step of encapsulating the constitutive members with the mold resin 10.

The mold resin 10 for encapsulating the power module may be, for example, a thermosetting resin such as an epoxy resin. The material of the lead frame 2 may be a copper or aluminium metal. For the heat sink member 6, for example, usable are metals such as aluminium or their alloys, and also ceramics such as alumina.

In the power module of this embodiment, the cured insulating sheet 77 that adheres the heat sink member 6 and the conductive member 2 has good heat conductivity, good adhesiveness and good insulating capability, which any conventional insulating heat-conductive resin sheet does not have, and therefore it enables down-sizing and increased capacity of the power module.

As in FIG. 12, when the cured insulating sheet 77 covers a metal heat sink member or an insulating plate such as alumina, then the difference in the thermal expansion coefficient between the constitutive member and the mold resin 10 may be reduced and interfacial delamination may be thereby prevented.

Since the insulating sheet has a high heat conductivity, it may serve also as a heat sink member 6 to exhibit a good heat radiation characteristic. As in FIG. 13, the cured form 77 of the insulating sheet 7 shown in FIG. 5 may serve also as a heat sink member to have a single-layered structure, which may reduce the difference in the thermal expansion coefficient between the sheet and the mold resin 10. Accordingly, this is more effective for preventing cracks, etc.

Embodiment 9

Figure 14:
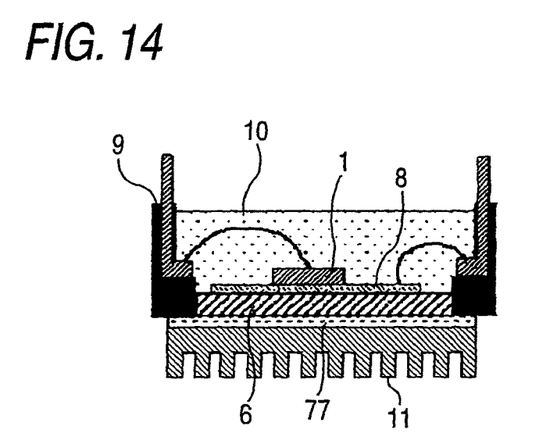
FIG. 14 is a constitutional view of a power module of an embodiment 9 of the invention.

FIG. 14 is a constitutional view of a power module of an embodiment 9 of the invention, which is a case-type power module.

Briefly, this includes a heat sink member 6, a circuit board 8 provided on the surface of the heat sink member 6, a power semiconductor device 1 mounted on the circuit board 8, a case 9 attached to the periphery around the heat sink member 6, a mold resin 4 injected into the case for encapsulating the circuit board 8 and the power semiconductor device 1 therein, and a cured insulating sheet 77 of the embodiments 1 to 7 stuck to the heat sink member 6 on the side opposite to the side thereof with the circuit substrate 8 provided thereon; and the heat sink member 6 is stuck to a heat spreader 11 by the cured insulating sheet 77.

In the power module of this embodiment, the cured insulating sheet 77 that adheres the heat sink member 6 and the heat spreader 11 has good heat conductivity, good adhesiveness and good insulating capability, which any conventional insulating heat-conductive resin sheet does not have, and therefore it enables down-sizing and increased capacity of the power module.

Example 1

As in Table 1, 200 parts by weight of methyl ethyl ketone was added to an adhesive component including 100 parts by weight of a bisphenol a-type epoxy resin (trade name: Epikote 828 by Japan Epoxy Resin) and 1 part by weight of a curing promoter, 1-cyanoethyl-2-methylimidazole (trade name: Curesol 2PN-CN by Shikoku Kasei); and then a filler member including a mixture of 143 parts by weight of a flattened filler, 7 μm boron nitride (trade name: GP by Denki Kagaku) and 201 parts by weight of a granular filler, 5 μm silicon nitride (trade name: SN-7 by Denki Kagaku) was added to it, mixed and kneaded with a three-roll kneader, and then defoamed in vacuum to prepare an insulating sheet composition A.

In the insulating sheet composition A, the proportion of the filler member to the overall volume of the adhesive component except methyl ethyl ketone and the filler member (filler member/insulating sheet) is 60% by volume. The ratio by volume of boron nitride to silicon nitride is 1/1.

TABLE 1

| | | | Insulating Sheet Composition A | Insulating Sheet Composition B | Insulating Sheet Composition C |
|---|---|---|---|---|---|
| Insulating Sheet | Adhesive Component | Epikote 828 (wt. pt.) | 100 | 100 | 100 |
| | | Curesol 2PN-CN (wt. pt.) | 1 | 1 | 1 |
| | Filler | Boron Nitride | 143 | 64 | 32 |

TABLE 1-continued

| | | Insulating Sheet Composition A | Insulating Sheet Composition B | Insulating Sheet Composition C |
|---|---|---|---|---|
| Member | (GP) (wt. pt.) Silicon Nitride (SN-7) (wt. pt.) | 201 | 90 | 45 |
| | Filler Member/Insulating Sheet (vol. %) | 60 | 40 | 20 |
| Methyl Ethyl Ketone (wt. pt.) | | 200 | 200 | 200 |

The insulating sheet composition A was applied onto the lubricant-coated surface of a polyethylene terephthalate sheet having a thickness of 100 μm and processed for lubrication on one surface thereof, according to a doctor blade coating process, statically left as such for 30 minutes to thereby make the filler member precipitate, and then heated and dried at 110° C. for 5 minutes. Then, another polyethylene terephthalate sheet was attached to the insulating sheet material composition A-coated surface of the sheet to prepare a B-stage laminate having a thickness of 55 μm.

Next, two of the B-stage laminate were prepared, and the polyethylene terephthalate sheet was peeled off from the lubrication-processed surface of each sheet, and the two were stuck together as in FIG. 10, with the peeled surfaces of the two facing each other, and pressed in vacuum at 130° C. under a pressure of 80 kgf/cm$^2$ to obtain an insulating sheet of an example of the invention having an overall thickness of about 200 μm. The heat conductivity in the thickness direction of the insulating sheet was measured, and the result is given in Table 2. The heat conductivity was measured according to a laser flash process.

An insulating sheet produced in the same manner as above was sandwiched between copper plates having a thickness of 2 mm to prepare an adhesiveness test piece. The tensile strength of between the copper plate and the insulating sheet was measured at a pulling rate of 50 mm/sec. In addition, the electric breakdown field intensity of the insulating sheet was measured, and the result is given in Table 2.

TABLE 2

| | Heat Conductivity (W/mK) | Adhesion Strength (MPa) | Electric Breakdown Field Intensity (kV/mm) |
|---|---|---|---|
| Example 1 | 13.5 | 8.2 | 56 |
| Example 2 | 13.8 | 8 | 55 |
| Example 3 | 13.3 | 8.3 | 60 |
| Example 4 | 15.6 | 8 | 53 |
| Example 5 | 14.8 | 7.9 | 58 |
| Example 6 | 13 | 8.1 | 57 |
| Comparative Example 1 | 14 | 0.2 | 58 |
| Comparative Example 2 | 6.2 | 8.3 | 60 |

Example 2

In the same manner as that for the insulating sheet composition A in Table 1, an insulating sheet composition B in Table 1 was prepared. The ratio by volume of boron nitride to silicon nitride in the insulating sheet composition B is 1/1, like in the insulating sheet composition A. In the insulating sheet composition, the proportion of the filler member to the overall volume of the adhesive component except methyl ethyl ketone and the filler member (filler member/insulating sheet) is controlled as in Table 1, whereby the heat conductivity of the insulating sheet of this example obtained in the manner mentioned below may be controlled to fall within the predetermined range shown in the above-mentioned embodiments of the invention.

The insulating sheet composition B was applied onto the lubricant-coated surface of a polyethylene terephthalate sheet having a thickness of 100 µm and processed for lubrication on one surface thereof, according to a doctor blade coating process, and then heated and dried at 110° C. for 5 minutes to obtain an insulating sheet B layer having a thickness of 35 µm (layer to be an adhesive face region). Then, the insulating sheet composition A was further applied onto it according to a doctor blade coating process, whereby an insulating sheet A layer having a thickness of 90 µm (layer to be an inner region) was laminated on it to give a B-stage laminate.

Next, two of the B-stage laminate were prepared, and they were laminated with the insulating sheet A layer surfaces of the two facing each other, to thereby obtain a laminate as in FIG. 9B. This was pressed in vacuum at 130° C. under a pressure of 80 kgf/cm$^2$ to obtain an insulating sheet of an example of the invention having an overall thickness of about 210 µm.

The heat conductivity of the thus-obtained insulating sheet was determined in the same manner as in Example 1. An insulating sheet produced in the same manner as above was sandwiched between copper plates having a thickness of 2 mm to prepare an adhesiveness test piece. Its tensile strength was measured at a pulling rate of 50 mm/sec. In addition, the electric breakdown field intensity of the insulating sheet was measured, and the result is given in Table 2.

Example 3

An insulating sheet composition a, an insulating sheet composition B and an insulating sheet composition C were prepared as in Table 1. The ratio by volume of boron nitride to silicon nitride in the insulating sheet composition C is 1/1, like in the insulating sheet composition A. In the insulating sheet composition, the proportion of the filler member to the overall volume of the adhesive component except methyl ethyl ketone and the filler member (filler member/insulating sheet) is controlled as in Table 1, whereby the heat conductivity of the insulating sheet of this example may be controlled to fall within the predetermined range shown in the above-mentioned embodiments of the invention.

First, the insulating sheet composition C was applied onto the lubricant-coated surface of a polyethylene terephthalate sheet having a thickness of 100 µm and processed for lubrication on one surface thereof, according to a doctor blade coating process, and then heated and dried at 110° C. for 5 minutes to obtain an insulating sheet C layer having a thickness of from about 5 to 7 µm. Then, the insulating sheet composition B was further applied onto it according to a doctor blade coating process, and heated and dried at 110° C. for 5 minutes to obtain an insulating sheet B layer having a thickness of 25 µm. The insulating sheet composition B was further applied onto it according to a doctor blade coating process, and heated and dried to form thereon an insulating sheet A layer having a thickness of 85 µm, thereby producing a B-stage laminate.

Next, two of the B-stage laminate were prepared, and they were laminated with the insulating sheet A layer surfaces of the two facing each other, and pressed in vacuum at 130° C. to obtain an insulating sheet of an example of the invention having an overall thickness of 220 µm.

The heat conductivity of the thus-obtained insulating sheet was determined in the same manner as in Example 1. An insulating sheet produced in the same manner as above was sandwiched between copper plates having a thickness of 2 mm to prepare an adhesiveness test piece. Its tensile strength was measured at a pulling rate of 50 mm/sec. In addition, the electric breakdown field intensity of the insulating sheet was measured, and the result is given in Table 2.

Example 4

An insulating sheet composition A and an insulating sheet composition B as in Table 1 were prepared.

Next, the insulating sheet composition B was applied onto the lubricant-coated surface of a polyethylene terephthalate sheet having a thickness of 100 µm and processed for lubrication on one surface thereof, according to a doctor blade coating process, and heated and dried at 110° C. for 5 minutes, and then, the insulating sheet composition A was further applied onto it according to a doctor blade coating process, and heated and dried to obtain a B-stage laminate having the same thickness as in Example 2.

Next, two of the B-stage laminate were prepared, and they were laminated such that a 50-µm thick copper sheet having 0.5 mmφ through-holes formed therein at intervals of 1 mm was sandwiched between the laminates with the insulating sheet A layer faces being inside to face the copper sheet, in a mode of vacuum pressing at 130° C., thereby producing an insulating sheet of an example of the invention having an overall thickness of 220 µm as in FIG. 7B.

The heat conductivity of the thus-obtained insulating sheet was determined in the same manner as in Example 1. An insulating sheet produced in the same manner as above was sandwiched between copper plates having a thickness of 2 mm to prepare an adhesiveness test piece. Its tensile strength was measured at a pulling rate of 50 mm/sec. In addition, the electric breakdown field intensity of the insulating sheet was measured, and the result is given in Table 2.

Example 5

An insulating sheet composition A and an insulating sheet composition B as in Table 1 were prepared.

Next, the insulating sheet composition B was applied onto the lubricant-coated surface of a polyethylene terephthalate sheet having a thickness of 100 µm and processed for lubrication on one surface thereof, according to a doctor blade coating process, and heated and dried at 110° C. for 5 minutes, and then, the insulating sheet composition A was further applied onto it according to a doctor blade coating process, and heated and dried to obtain a B-stage laminate having the same thickness as in Example 2.

Next, two of the B-stage laminate were prepared, and they were laminated such that a 100-µm thick alumina sheet having 1 mmφ through-holes formed therein at intervals of 2 mm was sandwiched between the laminates with the insulating sheet A layer faces being inside to face the alumina sheet, in a mode of vacuum pressing at 130° C., thereby producing an insulating sheet of an example of the invention having an overall thickness of 300 µm as in FIG. 7B.

The heat conductivity of the thus-obtained insulating sheet was determined in the same manner as in Example 1. An insulating sheet produced in the same manner as above was sandwiched between copper plates having a thickness of 2 mm to prepare an adhesiveness test piece. Its tensile strength was measured at a pulling rate of 50 mm/sec. In addition, the electric breakdown field intensity of the insulating sheet was measured, and the result is given in Table 2.

Example 6

An insulating sheet composition A and an insulating sheet composition B as in Table 1 were prepared.

Next, the insulating sheet composition B was applied onto the lubricant-coated surface of a polyethylene terephthalate sheet having a thickness of 100 μm and processed for lubrication on one surface thereof, according to a doctor blade coating process, and heated and dried at 110° C. for 5 minutes, and then, the insulating sheet composition A was further applied onto it according to a doctor blade coating process, and heated and dried to obtain a B-stage laminate having the same thickness as in Example 2.

Next, two of the B-stage laminate were prepared, and they were laminated such that a 0.8-mm thick glass laminate plate having copper-coated 0.5 mmφ through-holes formed therein at intervals of 2 mm was sandwiched between the laminates with the insulating sheet A layer faces being inside to face the glass laminate plate, in a mode of vacuum pressing at 130° C., thereby producing an insulating sheet of an example of the invention having an overall thickness of about 1 mm as in FIG. 8.

The heat conductivity of the thus-obtained insulating sheet was determined in the same manner as in Example 1. An insulating sheet produced in the same manner as above was sandwiched between copper plates having a thickness of 2 mm to prepare an adhesiveness test piece. Its tensile strength was measured at a pulling rate of 50 mm/sec. In addition, the electric breakdown field intensity of the insulating sheet was measured, and the result is given in Table 2.

Comparative Example 1

Using an insulating sheet composition A in Table 1, a 200-μm thick heat-conductive adhesive film was produced.

The heat conductivity of the thus-obtained heat-conductive adhesive film was measured in the same manner as in Example 1. A heat-conductive adhesive film produced in the same manner as above was sandwiched between copper plates having a thickness of 2 mm to prepare an adhesiveness test piece. Its tensile strength was measured at a pulling rate of 50 mm/sec in the same manner as in Example 1. In addition, the electric breakdown field intensity of the heat-conductive adhesive film was measured, and the result is given in Table 2.

Comparative Example 2

Using an insulating sheet composition B in Table 1, a 200-μm thick heat-conductive adhesive film was produced.

The heat conductivity of the thus-obtained heat-conductive adhesive film was measured in the same manner as in Example 1. A heat-conductive adhesive film produced in the same manner as above was sandwiched between copper plates having a thickness of 2 mm to prepare an adhesiveness test piece. Its tensile strength was measured at a pulling rate of 50 mm/sec in the same manner as in Example 1. In addition, the electric breakdown field intensity of the heat-conductive adhesive film was measured, and the result is given in Table 2.

Table 2 confirms that the insulating sheets of the examples of the invention have good adhesive strength, effectively satisfying both good heat conductivity and good insulating capability.

What is claimed is:

1. An insulating sheet comprising:
an inner region including a thermosetting resin and a first filler member, the first filler member containing a flattened filler and a granular filler which are mixed; and
an adhesive face region located on at least one side of the inner region, the adhesive face region including a second filler member, the second filler member containing only an electrically insulating flattened filler, wherein
the insulating sheet is a continuous layer and concentration of the first and second filler members gradually or successively increases in a direction from an adhesive face of the insulating sheet inwardly in the insulating sheet, and
the insulating sheet is an A-stage or a B-stage laminate.

2. A power module comprising:
a power semiconductor device;
a conductive member on which the power semiconductor device is mounted;
an insulating sheet according to claim 1 fitted to a first face of the conductive member, opposite a second face of the conductive member on which the power semiconductor device is mounted; and
a heat sink member fitted to the insulating sheet.

3. A power module comprising:
a power semiconductor device;
a circuit board on which the power semiconductor device is mounted;
a heat sink member on which the circuit board is located;
a case attached to a peripheral part of the heat sink member;
a molding resin in the case, sealing the circuit board and the power semiconductor device in the case;
an insulating sheet according to claim 1 fitted to a first face of the heat sink member, opposite a second face of the heat sink member on which the circuit board is mounted; and
a heat spreader fitted to the insulating sheet.

* * * * *